United States Patent [19]

Cramer, Jr.

[11] Patent Number: 4,503,436
[45] Date of Patent: Mar. 5, 1985

[54] BEAM FORMING NETWORK

[75] Inventor: Paul W. Cramer, Jr., San Gabriel, Calif.

[73] Assignee: The United States of America as represented by the Administrator of the National Aeronautics and Space Administration, Washington, D.C.

[21] Appl. No.: 448,441

[22] Filed: Dec. 10, 1982

[51] Int. Cl.³ .............................................. H01Q 3/24
[52] U.S. Cl. .................... 343/876; 343/356; 455/73
[58] Field of Search .................. 343/754, 853, 876; 455/73

[56] References Cited

U.S. PATENT DOCUMENTS

| | | | |
|---|---|---|---|
| 3,056,961 | 10/1962 | Mitchell | 343/876 |
| 3,747,114 | 7/1973 | Shyhalla | 343/814 |
| 3,854,140 | 12/1974 | Ranghelli et al. | 343/814 |
| 4,168,503 | 9/1979 | Davidson | 343/754 |
| 4,257,050 | 3/1981 | Ploussios | 343/372 |

Primary Examiner—Eli Lieberman
Attorney, Agent, or Firm—Paul F. McCaul; John R. Manning; Thomas H. Jones

[57] ABSTRACT

A feed element-to-beam interconnection network is provided for an antenna that transmits and receives a large number of beams, such as 87 contiguous narrow beams that cover the United States. The network, which is connected to a layer of 134 feed elements that transmit and receive microwaves, consists of a pair of circuit boards (160c, 162c in FIG. 7) parallel to the feed element layer. One of the two boards has 87 dividers (e.g. 51td, FIG. 5) that each divide a signal to be transmitted into seven portions, and the other board has 134 combiners (e.g. 38tc) that each collect seven transmit signal portions and deliver the sum to one of the feed elements. A similar arrangement is used to handle received signals, with 134 receive signal dividers (e.g. 38rd) on the one board, and 87 receive signal combiners (e.g. 51rc) on the other board. The large number of interconnections are made by printed circuit conductors radiating from each of the numerous dividers and combiners, and by providing interconnection pins (166) that interconnect the ends of pairs of conductors lying on the two boards. The printed circuit conductors (e.g. 38a, 51b) extend in undulating paths that provide maximum separation of conductors to minimize cross talk.

7 Claims, 10 Drawing Figures

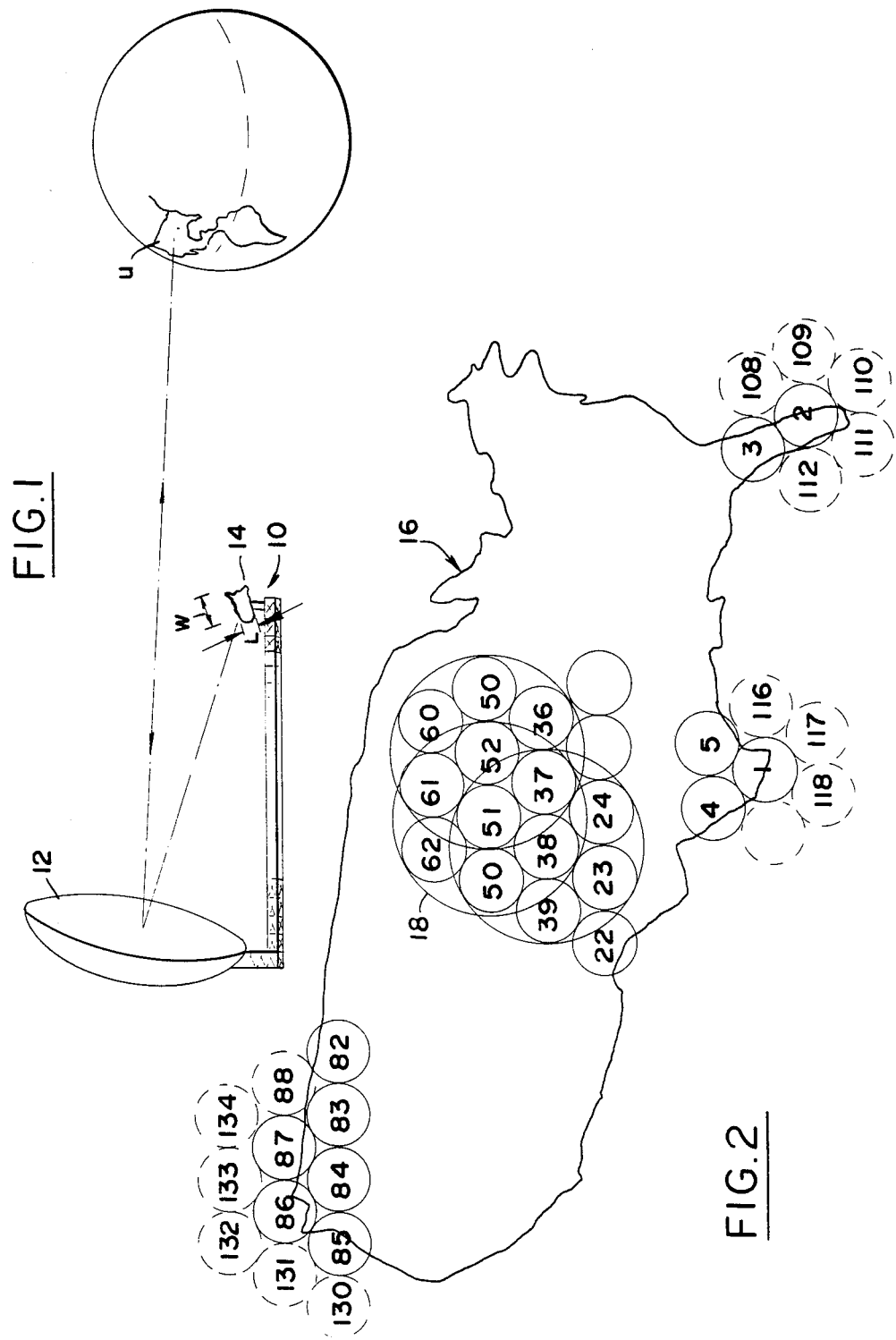

DIPLEXERS, POWER AMPS., LOW NOISE AMPS.

BEAM FORMING NETWORK

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

A communication satellite can relay large numbers of calls or messages between transceivers located within a wide area such as the continental United States, using only a moderate bandwidth for communication, by utilizing a large array of microwave transmitting and receiving beams. In order to produce narrow transmit and receive beams with low side lobe levels, a large feed aperture is required for each beam, that is several times larger than the available space between the centers of the feed apertures for adjacent beams. In effect, the apertures of adjacent beams must overlap. This can be accomplished using an array of relatively small feed elements, where adjacent beams can share elements which are common to the apertures of each beam. In one system, which utilizes 87 beams to cover the continental United States, 134 feed elements are utilized, with each transmitted or received beam being produced by a group of seven feed elements. Each of the 87 transmit signals must be distributed over seven feed elements, by dividing each transmit signal into seven portions, combining portions of seven different transmit signals, and delivering the combined signals to 134 feed elements. The reverse must be separately performed for the signal received by each of the 134 feed elements. Accordingly, a very large number of interconnections must be made. In satellite systems, it is important to minimize the weight of the circuitry, which could be considerable, to perform the necessary connections. An interconnection network which minimized the number of circuit boards and the weight of wiring for interconnecting various elements, would be of considerable value in simplifying and minimizing the weight of communications systems.

SUMMARY OF THE INVENTION

In accordance with one embodiment of the present invention, an interconnection arrangement is provided for connecting a large number of lines carrying signals to be transmitted to a network of feed elements. The system includes first and second parallel circuit boards, a large number of transmit dividers mounted on the second board, and a large number of transmit combiners mounted on a first board. Each transmit divider has an input for receiving a transmit signal and has several outputs for carrying portions of the transmit signal. Each transmit combiner has several inputs for receiving portions of different transmit signals, and has an output connected to one feed element. The output lines of each transmit divider lies in the plane of the second board and extends part of the lateral distance towards a corresponding combiner on the first board. Similarly, the input lines of each combiner on the first board lie in the plane of the first board and extend part of the lateral distance towards a corresponding divider, so that the ends of input and output lines on the two boards lie over one another. A group of inter-board connectors, such as simple pins, extend between the boards to connect the ends of input and output lines.

The receiving circuitry can be mounted on the same circuit boards as the transmit circuitry, by placing a large number of receive dividers on the first board at positions interspersed with those of the transmit combiners on the first board. Similarly, a large number of receive combiners are interspersed with the transmit dividers of the second board. Each receive divider and receive combiner has several lines extending therefrom, so the ends of each receive divider output line lies over the end of a receive combiner input line, so the ends can be connected by interboard connectors extending perpendicular to the boards. All of the lines on each board extend largely radially from the corresponding divider or combiner, but in undulating paths. The undulating paths are formed so that no receive line intersects a transmit line, and also to separate lines as far from one another as possible in the limited space, to minimize cross talk between lines.

The novel features of the invention are set forth with particularity in the appended claims. The invention will be best understood from the following description when read in conjunction with the accompanying drawings.

BRIEF DESCRIPTION OF THE DRAWINGS

FIG. 1 is a simplified perspective view of a communications system constructed in accordance with the present invention, showing communication between a satellite and a portion of the earth.

FIG. 2 is a plan view showing the areas of the earth covered by different beams of the system of FIG. 1, and showing how groups of beam elements are utilized to form a beam.

FIG. 4A is a block diagram of the circuit of FIG. 4.

DESCRIPTION OF THE PREFERRED EMBODIMENTS

Figure 3:
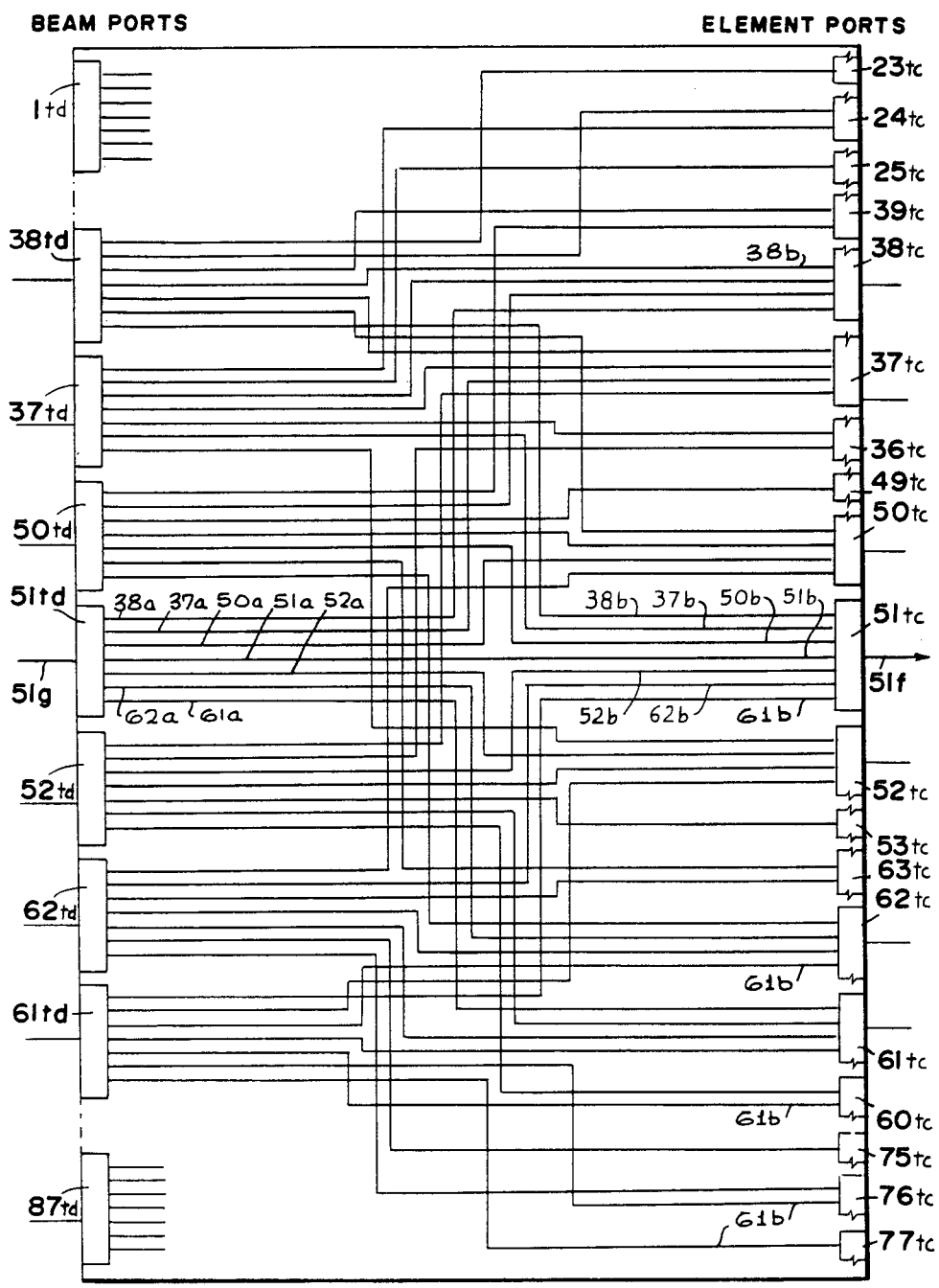
FIG. 3 is a schematic diagram showing a portion of the interconnections required in the circuitry of the system of FIG. 1.

FIG. 1 illustrates a geo-stationary satellite communication system 10 constructed to transmit and receive microwave electromagnetic signals to and from any location within the continental United States U. The system includes a large dish reflector 12 of a diameter such as 55 meters, and a feed panel assembly 14 containing a matrix of feed elements for transmitting and receiving signals reflected from the reflector 12. The system is designed to transmit narrow beams, of a 3db beam width of about 0.44 degrees, and to receive signals with the same discrimination, so that each beam covers a land area of a few hundred miles diameter. This allows the same frequency band to be utilized in a large number of different sectors of the United States, to minimize the size of the overall frequency band required to provide the required communication capacity over the entire continental United States.

In the particular system 87 different beams are utilized, which are distributed in the manner shown in FIG. 2, to cover the entire United States. The outline 16 of the United States is distorted to show its appearance as seen from a satellite over the equator.

If the side lobe performance were not critical and poor isolation between beams could be tolerated (high cross-talk), then it would be possible to use a matrix of 87 feed elements in the configuration of FIG. 2, i.e. one element per beam (but in an upside-down mirror image) and thus feed a single transmit signal to each element to form a corresponding beam. However, where high isolation (low cross-talk) dictates low side lobes, this cannot be done. To provide the required illumination of reflector 12 needed to produce low side lobes in the antenna patterns, the feed apertures must be several times greater than the available space between the centers of the feed apertures for adjacent beams. In one system that has been designed, the feed panel assembly 14 had a width W of about eleven meters and a length L of about seven meters, and the system operated between 821 and 876 MHz. Narrow beams are obtained by using groups of seven feed elements, with each of 134 elements having a width of about 0.69 meters, to provide feed apertures of six wavelengths diameter. The array of feed elements had the general arrangement shown in FIG. 2. Each beam is formed by utilizing a group 18 of seven feed elements, including a center element such as at position 51, and six surrounding elements, such as at the positions 37, 38, 50, 62, 61 and 52, to produce a beam centered at the location 51. In order to account for beams such as at element 87 which are directed to an area near the border of the continental United States, additional elements such as 88, 134, 133 are required to complete the ring of six feed elements needed to surround each element that is centered on a beam. It should be noted that the beam at position 38 shares elements at positions 37, 38 50 and 51 with the beam at position 51.

While the above-described arrangement, which may utilize 134 separate elements to form 87 beams or to receive such beams, enables low side lobe levels to be maintained for a feed panel assembly of moderate size, it gives rise to difficulties in making interconnections. For example, a transmit signal which is to be transmitted to a particular sector of the United States, such as sector 51, must be divided into seven portions that must each be fed to each of seven feed elements in a cluster. Each of the feed elements also must have seven inputs to receive portion of different transmit signals from seven adjacent beams. In a similar manner, the signal received by each feed element, such as at the position 51, contains signals from seven different sectors of the United States. Accordingly, signals received by each feed element must be delivered to seven devices that combine portions of various received signals from other feed elements to generate a single receive signal representing the signal transmitted from a particular sector such as 51. Complex interconnections must be made.

FIG. 3 shows the general arrangement of interconnections of element and beam ports which is described hereafter for downlink communication, that is, for transmitting a signal. An original transmit signal associated with beam 51 may be assumed to be delivered on line 51g to a transmitter divider 51td. The divider has seven output leads or lines labeled 38a, 37a, 50a, 51a, 52a, 62a, and 61a, that each carry a portion of the amplitude of the original signal on line 51g. These output lines such as 38a are connected to the input lines of seven transmitter combiners labeled 38tc, 37tc, 50tc, 51tc, 52tc, 62 tc, and 61tc which are in turn connected to feed elements (FIG. 2) 38, 37, 50, 51, 52, 62 and 61 to form the feed aperture for beam 51. Each of these combiners such as 51tc has seven input lines, such as 38b and 61b that receive signals from the transmit dividers such as 38td and 61td. The output signal of the combiner on line 51f, is delivered to a feed element 51e.

It can be seen from FIG. 3 that a large number of conductors are required to interconnect the divider and combiners, and that there are many overlappings of the conductors. It would be possible to use individual insulated coaxial cables to make the connections, but this results in great weight and reduced realiability, which would be important disadvantages in satellite systems. Further complexity arises because a similar arrangement must be utilized in uplink communication, that is, in receiving a signal. In that case, each feed element such as 51e must pass the received signal (which includes signals from seven sectors of the United States) through a divider that divides the receive signal into seven portions that are delivered to seven receive signal combiners.

Figure 4:
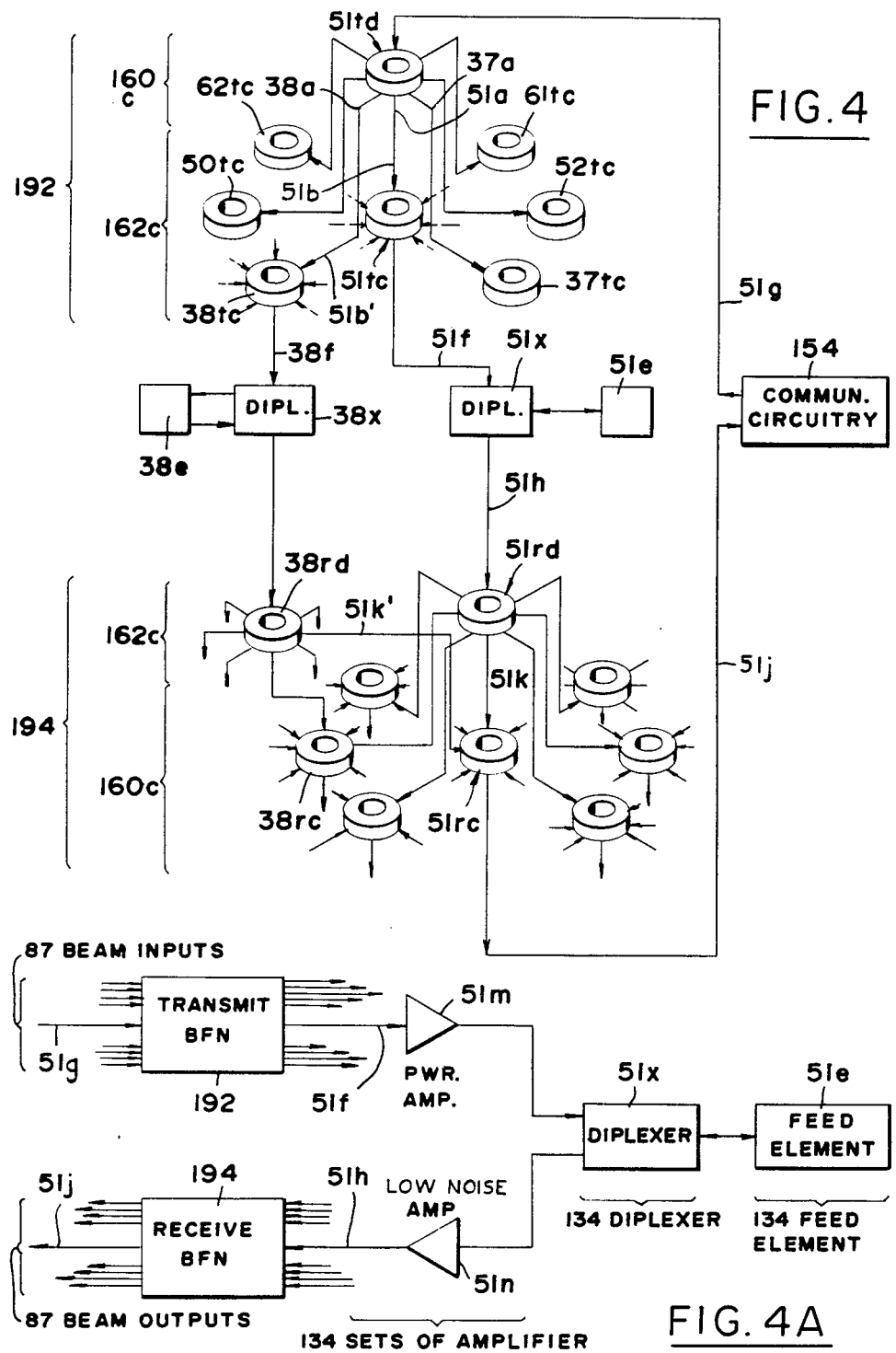
FIG. 4 is a simplified partial perspective view of a portion of the circuit of FIG. 3, showing one manner of its implementation.

FIG. 4 illustrates one embodiment of the system wherein torroidal ferromagnetic cores each with eight windings, are utilized as dividers and combiners. A transmit signal for beam 51 arrives from the satellite communication system on the line 51g and is delivered to the transmit divider transformer 51td. The divider may have eight sets of turns of wire thereon, with the first set receiving a current from line 51g and the other seven coils receiving portions of the signal in proportion to the turns of each coil. The seven output lines 51a, 38a, 37a, etc. from the transmitter divider 51td are delivered to seven transmitter combiners 51tc, 38tc, 37tc, etc. which also are formed by torroidal coils with eight sets of turns of wire thereon. The output 51f of the combiner 51tc is delivered through a power amplifier (not shown) and a diplexer 51x, to feed element 51e which radiates microwave energy corresponding to the signal on line 51f. Similarly, the combiner 38tc which receives seven signals, delivers the combined signal on a line 38f to a power amplifier (not shown) and a diplexer 38x to its feed element 38e which radiates microwave energy. Thus, the circuit takes the original transmit signal on line 51g and breaks it into seven portions that are radiated from seven elements such as elements 38e and 51e.

FIG. 4 also shows a portion of the uplink, or receiver, circuitry of the system. When a microwave signal is transmitted from the earth, from a location within the sector 51 (FIG. 2) of the United States, that signal is received by seven elements, including the elements 51e and 38e. The output of element 51e is delivered through diplexer 51x, a low noise amplifier (not shown) and finally through line 51h to receiver signal divider 51rd. Divider 51rd has seven outputs that are delivered to seven combiners, including an output on line 51k to receive signal combiner 51rc. Although input to the combiner 51rc is a signal on line 51k' from the divider 38rd. The combined signal on line 51j, is delivered to communication circuitry 154 of the satellite.

FIG. 4A shows the circuit between each feed element such as 51e, and both the transmit beam forming network 192 and the receiving beam forming network 194. A transmit signal on line 51g, representing a signal to be transmitted to one sector 51 on the earth, is distributed by the network 192. Portions of seven transmit signals are delivered on network output line 51f through a power amplifier 51m and diplexer 51x to the feed element 51e. The microwave signal received by the feed element 51e containing signals from seven sectors on the earth, passes through the diplexer 51x and a low noise amplifier 51n to the receiving network 194. One output 51j of network 194 represents signals transmitted from one sector 51 on the earth. There are 87 inputs to network 192 and 87 outputs from network 194. There are 134 outputs from network 194, and 134 power amplifiers, low noise amplifiers, diplexers, and feed elements.

Figure 5:
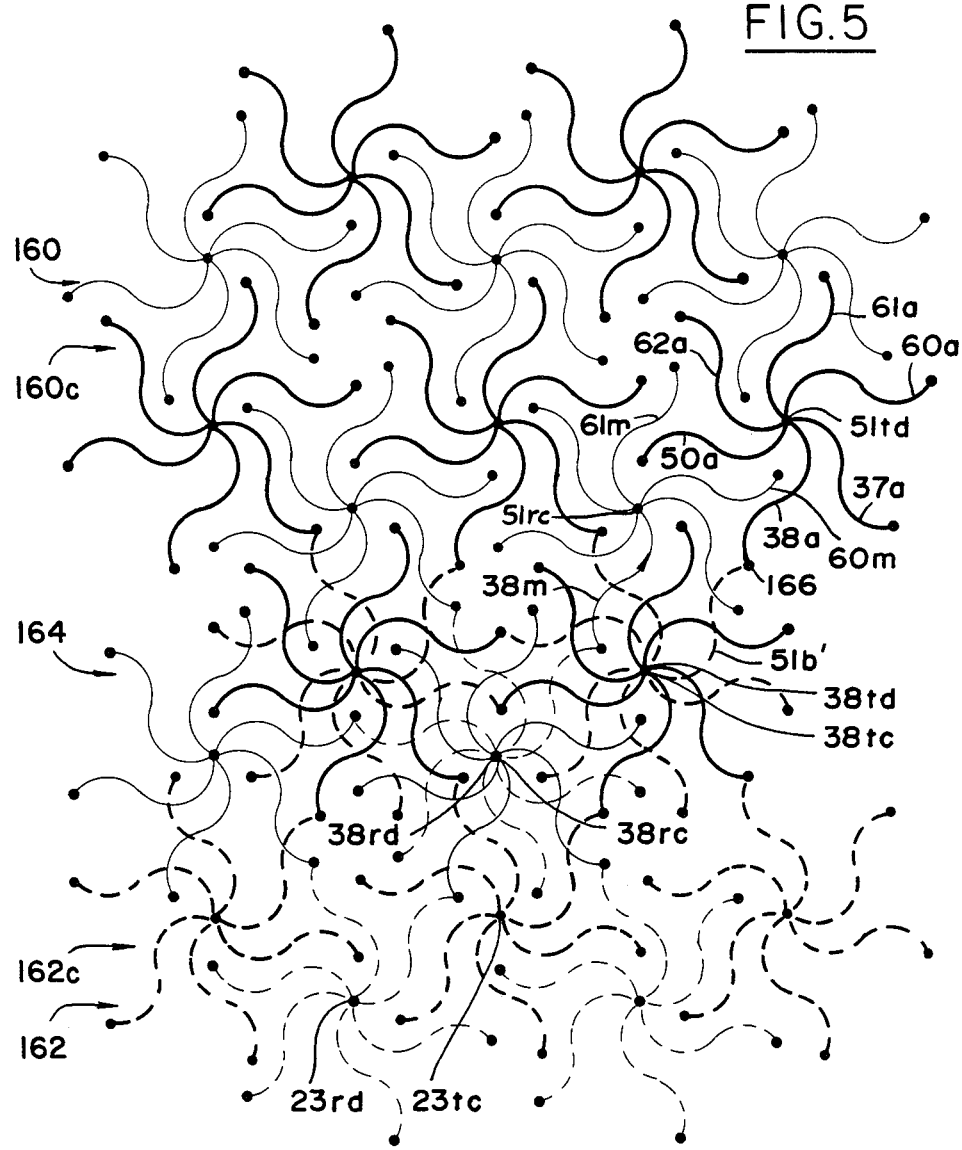
FIG. 5 is a plan view of a portion of a circuit of the type shown in FIG. 4, showing portions of two circuits overlaid in the plane of the boards.

It would be desirable if the transmitter and receiver dividers and combiners such as 51td, 51tc, 51rd, and 51rc shown in FIG. 4, and all the interconnections could be placed on a minimum number of circuit boards, and if interconnections could be made by printed circuit techniques which are most easily made where all the conductors on a board are separate and do not cross another. The planar circuits 160c, 162c shown in FIG. 5 enable the transmitter and receiver dividers and combiners and all interconnections, to be placed on only two circuit boards, and with interconnections formed by printed circuit techniques without overlapping of the leads. One circuit board 160 supports the transmitter dividers such as 51td and the receiver combiners such as 51rc. The circuit 160c on board 160 also includes six of the seven leading extending from each transmitter divider (td) and receiver combiner (rc). For example, the divider 51td has six leads 38a, 50a, 62a, 61a, 52a, and 37a which are strips of foil formed by printed circuit methods on the board 160. A seventh lead (51a) is not shown, as it extends from board 160 to the next board and may extend perpendicular to the board 160.

Figure 5A:
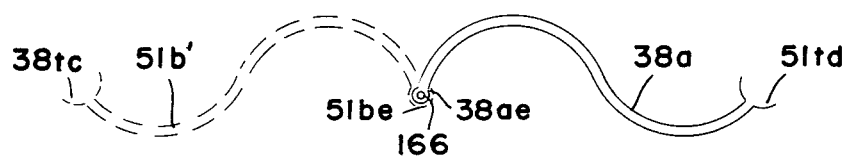
FIG. 5A is a view of a portion of FIG. 5.

The circuit 162c on the other circuit board 162 contains the transmitter combiners such as 23tc and receiver dividers such as 23rd of the system. At the area 164 in FIG. 5, the two boards 160 and 162 are shown overlapped to show how interconnections are made. Thus, the output lead 38a from the transmitter divider 51td is connected to an input lead 51b' of the transmitter combiner 38tc that lies on the second board 162. The connection between the leads 38a on one board and 51b' on another board is made by means of an interconnection pin 166 that passes between the boards by extending perpendicular to them. This is possible because the ends 38ae, 51be (FIG. 5A) of two leads such as 38a, 51b' on different boards, have substantially the same lateral position. It can be seen that each output line or lead such as 38a of a divider extends at least ¼ of the lateral distance to the combiner 38tc to which it connects. Similarly, each input line or lead such as 51b' of a combiner extends at least ¼ of the lateral distance to the divider 51td to which it connects.

Each circuit such as 160c on board 160, is of the etched printed circuit type formed of strips of foil, and may be said to lie in the plane of a face of the board. Each printed circuit is supported over a ground plane by a dielectric material which may be solid or a honeycomb. This type of board is sometimes referred to as microstrip or stripline. It would be possible to locate boards 160 and 162 back-to-back so they shared a common ground plane. Then the two circuits 160c and 162c would be on opposite faces of the pair of boards. As viewed in FIG. 5 wherein the circuits 160c, 162c overlap, the divider and combiner elements of different circuits are at the same lateral positions and therefore one is hidden from view by the other. The entire arrangement can be appreciated by viewing the perspective view of FIG. 6.

The six leads, such as 38a (FIG. 5) radiating from a divider and combiner, extend generally in a radial direction, but undulate in the manner of a sine wave. This configuration avoids overlapping of leads on the same circuit board, and also provides a large average (root mean square) spacing between leads to minimize crosstalk between them. Of the six leads radiating from a network element such as transmit divider 51td, three alternate leads 50a, 61a, and 37a lie closely between a pair of receiver combiner leads (such as 61m, 60m for lead 50a), and also lie nearer the corresponding receiver combiner such as 51rc than the transmit divider such as 51td from which the lead extends.

Figure 6:
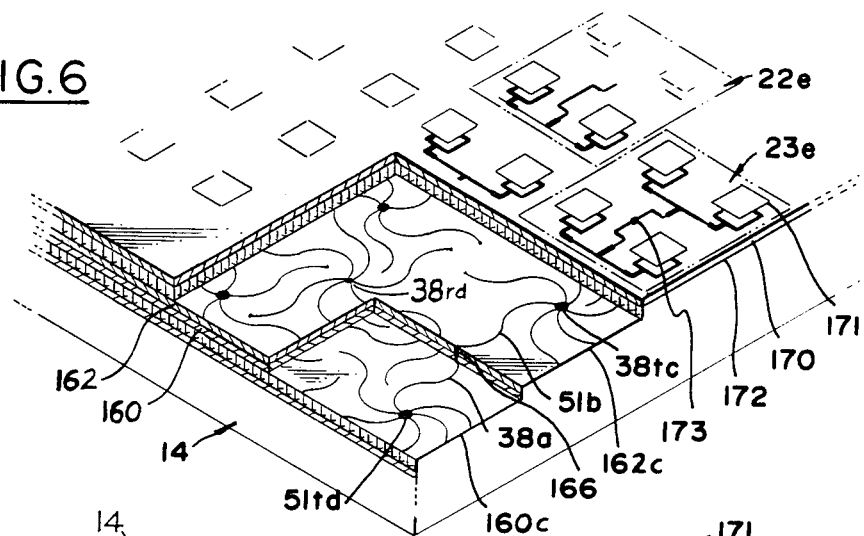
FIG. 6 is a partial perspective view of a feed panel assembly that includes the circuit portions of FIG. 5.
Figure 7:
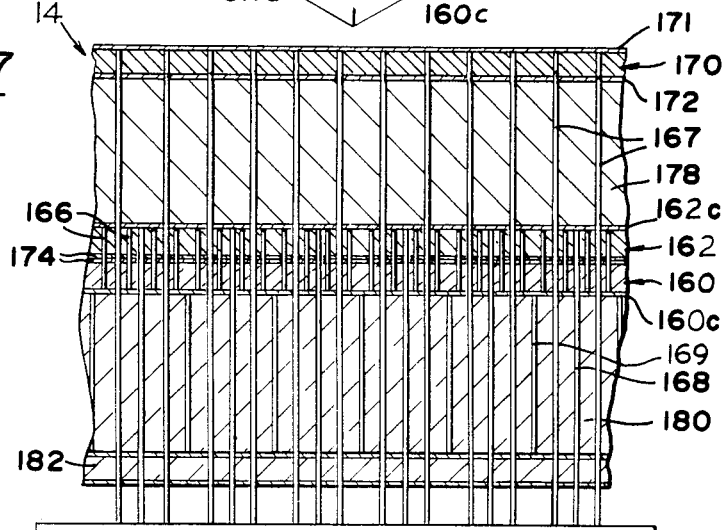
FIG. 7 is a partial sectional view of the circuit of FIG. 6.

FIG. 6 shows various elements of the feed panel assembly 14. The feed elements such as 22e, 23e are formed as foil layers 171 supported by a dielectric 170 over a ground plane plate 172. Each feed element such as 23e is connected at a location 173 thereon by an interconnection cable to a corresponding diplexer. A power amplifier such as for element 23e is connected by an interconnecting cable to a lead at the corresponding transmitter combiner (tc) on the first circuit board 162. A low noise amplifier such as for element 23e is connected by another interconnecting cable to a receiver divider (rd) also located on the first circuit board 162. The second circuit board 160 is located back to back to the first board 162 and on the side opposite of the board pair relative to the feed element layer 171. Additional circuitry lies in layers under the second circuit board 160, including transmission lines, diplexers, and amplifiers. FIG. 7 shows a partial cross-section of the feed panel 14, showing ground planes 172, 174 of the boards. Honeycomb spacers 178, 180 lie between the divider and combiner boards 160, 162, and both the feed element board 170 and additional circuitry at 182. Interconnection pins 166 interconnect leads on the boards 160, 162. Coasical cables 167 connect diplexers to the feed elements on layer 171, coaxial cables 168 connect board 162 to the amplifiers and coaxial cables 169 connect board 160 to additional circuitry at 182.

Figure 8:
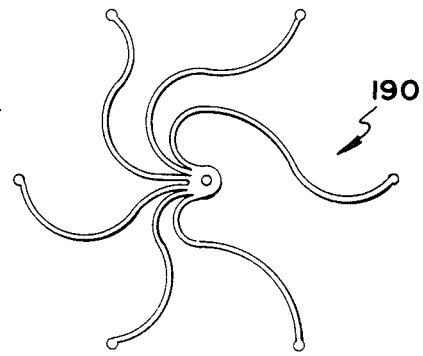
FIG. 8 is a plan view of a network element of a system constructed in accordance with another embodiment of the invention.

Although the divider and combiner network elements can be transformer elements of the type shown in FIG. 4, other types of devices can be used. FIG. 8 shows a network element 190, which can be a combiner or divider constructed as a microstrip device formed of foil over a ground plane. Transformer elements are useful for lower to medium frequencies up to about 1000 MHz, while microstrip devices are useful at medium to higher frequencies.

Thus, the invention provides an interconnection arrangement for a communications system that must apportion a transmit signal among a group of feed elements, and which must combine portions of a receive signal received from each of a group of the feed elements. The arrangement enables the interconnections to be made primarily by leads extending on the planes of a limited number of circuit boards such as two of them, without crossings on any boards, to enable the interconnection leads to be formed by strips of metal foil, for ease of construction and minimal weight. The transmit portion can be constructed by utilizing a pair of circuit boards lying in closely spaced parallel planes, one board carrying transmit dividers and the other carrying transmit combiners, with a group of leads largely radiating from each divider and combiner. The leads of the divider and combiner extend to lateral positions at which they can be interconnected by a pin extending perpendicular to the planes of the circuit boards. The same two boards can be used for the receive circuitry, by mounting receive dividers interspered with the transmit combiners of one board, and the receive combiners interspersed with the transmit dividers on the other board. The leads extend in a generally radial direction from each combiner or divider, but in an undulating fashion similar to a single sine wave, to avoid intersection of leads and to maximize the distance between adjacent leads so as to minimize cross talk.

Although particular embodiments of the invention have been described and illustrated herein, it is recognized that modifications and variations may readily occur to those skilled in the art and consequently, it is intended that the claims be interpreted to cover such modifications and equivalents.

What is claimed is:

1. In an electromagnetic communication system which includes a network of feed elements that operate in groups so that each feed element can receive separate portions of a transmit signal and form therefrom a combined electromagnetic transmit beam, the improvement including:

first and second substantially planar circuits lying in closely spaced parallel planes;
   a plurality of transmit dividers mounted on said second circuit, each divider having an input for receiving a transmit signal and a plurality of output lines;
   a plurality of transmit combiners mounted on a first circuit, each combiner having a plurality of input lines, so that each combiner can receive a portion of several signals from several corresponding divider output lines, each combiner having an output coupled to one of said feed elements;
   a plurality of the output lines of each divider extending in the plane of the second circuit, each output line extending at least one-fourth of the distance towards the lateral position of a transmit combiner and having an output line end;
   a plurality of the input lines of each combiner extending in the plane of the first circuit, each input line extending at least one-fourth of the distance towards the lateral position of a divider and having an output line end lying at the same lateral position as a corresponding divider output line end; and
   a plurality of interboard connectors, each extending perpendicular to the planes of said circuits and each connecting the end of a divider output line to the end of the combiner input line that lies at the same lateral position.

2. A microwave transceiver comprising:
   an antenna structure which includes a feed element support and a matrix of feed elements mounted on said support;
   first and second substantially planar circuits lying in closely spaced and parallel planes, with said first circuit closest to said feed element support and said second circuit lying on a side of said first circuit which is opposite said feed element support;
   a plurality of diplex means coupled to said feed elements, each having a transmit signal input and a receive signal output, for delivering and receiving signals;
   said first circuit including a plurality of transmit combiners each having input leads in the plane of said first circuit and an output connected to the transmit input of a diplexer, and a plurality of receive dividers interspersed with said combiners and with each receive divider having an input connected to the receive output of said diplexer and having a plurality of output leads in the plane of said first circuit and in nonoverlapping relationship with said transmit combiner output leads;
   said second circuit including a plurality of transmit dividers each having an input for receiving a transmit signal and a plurality of output leads in the plane of said second circuit, and said second circuit including a plurality of receive combiners interspersed with said transmit dividers and with each receive combiner having an output for delivering a receive signal and a plurality of input leads lying in the plane of said second circuit and in nonoverlapping relationship with said transmit divider leads; and
   means for connecting the ends of transmit combiner input leads at said first circuit to the ends of transmit divider output leads of said second circuit, and for connecting the ends of receiver divider output leads of said first circuit to the ends of receiver combiner input leads of said second circuit.

3. The transceiver described in claim 2 wherein:
   a plurality of input leads of each transmit combiner extend in undulating paths that generally radiate from the combiner and that have outer ends radially spaced from the combiner;
   a plurality of output leads of each receiver divider extend in undulating paths that generally radiate from the divider and that have outer ends radially spaced from the divider;
   alternate radiating leads of each transmit combiner having outer ends lying between a pair of receiver divider leads, at a location close to the corresponding receiver divider.

4. In a microwave transceiver which includes network elements including transmit dividers and combiners and receiver dividers and combiners, the improvement wherein:
   a plurality of dividers and combiners lie on the same circuit in substantially the same plane and are interspersed, with each divider having a plurality of output leads lying in a circuit plane and each combiner having a plurality of input leads lying substantially in said circuit plane in nonoverlapping relationship to said divider output leads;
   said output and input leads extending in largely sine wave paths that extend generally radially away from, respectively, the divider and combiner;
   at least some of said output leads having ends that lie between a pair of input leads, and at least some of said input leads having ends that lie between a pair of output leads.

5. The improvement described in claim 4 including:
   a second circuit having a plurality of dividers and combiners on the same circuit and interspersed, and with leads from each lying in a second circuit plane parallel to said first named plane and radiating in a manner similar to those in said first circuit plane;

the ends of transmit divider and combiner leads on the two circuit planes lying at the same lateral position and interconnected; and the ends of receiver divider and combiner leads on the two circuit planes lying at the same lateral position and interconnected.

6. In an electromagnetic communication system which includes a network of feed elements that operate in groups so that each feed element can receive separate portions of a transmit signal and form therefrom a combined electromagnetic transmit beam, and so each feed element can receive a portion of a beam and form such portions into a combined received signal, the improvement including:

first and second substantially planar circuits lying in closely spaced parallel planes;

a plurality of transmit dividers mounted on said second circuit, each divider having an input for receiving a transmit signal and a plurality of output lines;

a plurality of receive combiners mounted on said second circuit and interspersed with said transmit dividers on said second circuit, each receive combiner having a plurality of input lines lying in the same plane as said transmit divider output lines, and each receive combiner also having an output line;

a plurality of transmit combiners mounted on said first circuit, each combiner having a plurality of input lines, so that each combiner can receive a portion of several signals from several corresponding transmit divider output lines, each combiner having an output coupled to one of said feed elements;

a plurality of receive dividers mounted on said first circuit and interspersed with said transmit combiners on said circuit, each receive divider having an input conncted to one of said feed elements, and a plurality of output lines lying in the same plane as said transmit combiner input lines;

a plurality of the output lines of each divider extending in the plane of its circuit, each output line extending part of the distance towards the lateral position of a corresponding combiner and having an output line end;

a plurality of the input lines of each combiner extending in the plane of its circuit, each output line extending part of the distance towards the lateral position of a corresponding combiner and having an output line end;

a plurality of interboard connectors, each extending perpendicular to the planes of said circuits and each connecting the end of a divider output line to the end of a combiner input line that lies at the same lateral position.

7. The improvement described in claim 6 wherein:
the patterns of said transmit and receive divider output lines and combiner input lines form substantially the pattern shown in FIG. 5.

* * * * *